United States Patent
Lee et al.

(10) Patent No.: US 7,656,498 B2
(45) Date of Patent: Feb. 2, 2010

(54) METHOD OF MANUFACTURING MULTI-PANEL DISPLAY DEVICE

(75) Inventors: Young-gu Lee, Suwon-si (KR); Tae-sik Oh, Suwon-si (KR); Sung-kee Kang, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 328 days.

(21) Appl. No.: 11/498,515

(22) Filed: Aug. 3, 2006

(65) Prior Publication Data

US 2007/0222937 A1    Sep. 27, 2007

(30) Foreign Application Priority Data

Mar. 21, 2006    (KR) .................. 10-2006-0025674

(51) Int. Cl.
*G02F 1/13* (2006.01)
*G02F 1/1333* (2006.01)

(52) U.S. Cl. .................. 349/187; 349/158; 349/160

(58) Field of Classification Search .................. 349/187, 349/158, 160
See application file for complete search history.

(56) References Cited

U.S. PATENT DOCUMENTS

| | | | | |
|---|---|---|---|---|
| 5,851,411 | A * | 12/1998 | An et al. ......................... | 216/23 |
| 5,905,559 | A * | 5/1999 | Fujiwara et al. .............. | 349/190 |
| 7,265,805 | B2 * | 9/2007 | Jung ........................... | 349/153 |
| 2004/0141139 | A1 * | 7/2004 | Yamazaki et al. ........... | 349/151 |
| 2005/0118921 | A1 * | 6/2005 | Jung ........................... | 445/24 |

* cited by examiner

*Primary Examiner*—K. Cyrus Kianni
(74) *Attorney, Agent, or Firm*—Cantor Colburn LLP

(57) ABSTRACT

A method of manufacturing a multi-display panel comprises mounting a plurality of display elements on a substrate, covering the substrate and the display elements with a glass cover having walls for partitioning each of the display elements; and cutting the substrate and the glass cover along the walls and separating the display elements to respectively form image units. Thus, the width of a connection portion between the image units is less than half of that in the conventional art and a display image formed by two separate images looks natural.

8 Claims, 3 Drawing Sheets

METHOD OF MANUFACTURING MULTI-PANEL DISPLAY DEVICE

This application claims priority to Korean Patent Application No. 10-2006-0025674, filed on Mar. 21, 2006, and all the benefits accruing therefrom under 35 U.S.C. §119, the contents of which in its entirety are herein incorporated by reference.

BACKGROUND OF THE INVENTION

1. Field of the Invention

The present invention relates to a multi-panel display manufacturing method, and more particularly, to a multi-panel display manufacturing method in which a connecting portion width between panels of the multi-panel display is reduced.

2. Description of the Related Art

Generally, a plurality of display panels are connected in a multi-panel display device to form a large image display. In the past, a large image display was formed by connecting a plurality of cathode-ray tubes ("CRTs") such as television sets. Recently, however, a large image display is formed by connecting flat display panels such as liquid crystal displays ("LCDs"), field emission displays ("FEDs"), plasma display panels ("PDPs"), or electro luminescent displays ("ELDs") according to the type of an image to be displayed on the multi-panel display device.

When manufacturing a multi-panel display device including flat display panels, generally, panel units having the flat display panels are formed separately, and the panel units are connected to each other in a folding manner using hinges or adhesives in order to form a large image display. For example, when two panel units are used, two display panels are respectively prepared by separate manufacturing processes. Then, the large image display is formed by connecting the two display panels with hinges in a folding manner or by applying an adhesive to one edge of the two panels and adhering an edge of the other panel thereto.

However, this manufacturing problem has several disadvantages. First, since the connecting portion width of the two panels is very large, the images displayed by each display panel are not smoothly connected and a discontinued image is generated in the connecting portion. That is, as shown in FIG. 1, a flat display panel is constructed by mounting a display element 4 on a substrate 1 and sealing the display element 4 with a glass cover 2. Basically, the glass cover 2 has an edge thickness t1 and furthermore an adhesive is applied to the connecting portion. Thus, when adjacent panels are attached to each other using the adhesive, the width of the connecting portion is very large. The width W of the connecting portion is defined by twice the edge thickness t1 of the glass cover 2 plus twice the thickness t2 of the adhesive. In this manner, a discontinued image is displayed in the connection portion defined by width W. When the panels are connected in a folding manner using a hinge, the minimum width of the connecting portion is twice the edge thickness t1 of the glass cover 2, so that a discontinued image is displayed in this case too.

Second, the total number of the processes is increased since the panel units are produced through separate processes and then the panels are subsequently connected to each other. That is, when two panels are used, after each panel has been formed by a separate process, they are subsequently connected in a folding manner by using an adhesive, thus increasing the manufacturing time.

Third, since the panels are formed by separate processes and subsequently connected to each other, the quality of the multi-panel display device may suffer due to characteristic differences between the panels as a result of being formed by the separate processes.

Thus, in order to address these problems, a new manufacturing method for a multi-panel display device is desired.

BRIEF SUMMARY OF THE INVENTION

The present invention provides a method of manufacturing a multi-display panel, which is simple and by which the characteristic difference between panels and the width of a connection portion are reduced, thereby making it possible to display a natural image on the multi-display panel.

The present invention also provides a method of manufacturing a multi-display panel, comprising mounting a plurality of display elements on a substrate, covering the substrate and the display elements with a glass cover having walls for partitioning each of the display elements, and cutting the substrate and the glass cover along the walls and separating each of the display elements to respectively form image units.

According to an aspect of the present invention, the covering of the substrate and the display elements with the glass cover comprises applying an adhesive on the substrate at locations corresponding to the walls of the cover glass along the walls, and adhering the glass cover to the substrate.

It is preferable that the width of the wall be less than about 1.0 mm and the width of the wall after cutting be less than about 0.5 mm.

According to another aspect of the present invention, a passivation layer may cover the display elements. The passivation layer may be formed of one of $Al_2O_3$, $SiO_2$, poly vinyl acetate (PVA), photo acryl (PA) or polyimide (PI).

The display element may be one of an LCD, an FED, an OLED and a PDP, and the cutting may be by mechanical cutting using a cutting tool or optical cutting using a laser.

BRIEF DESCRIPTION OF THE DRAWINGS

The above and other aspects, features and advantages of the present invention will become more apparent by describing exemplary embodiments thereof with reference to the attached drawings in which.

DETAILED DESCRIPTION OF THE INVENTION

Figure 1:
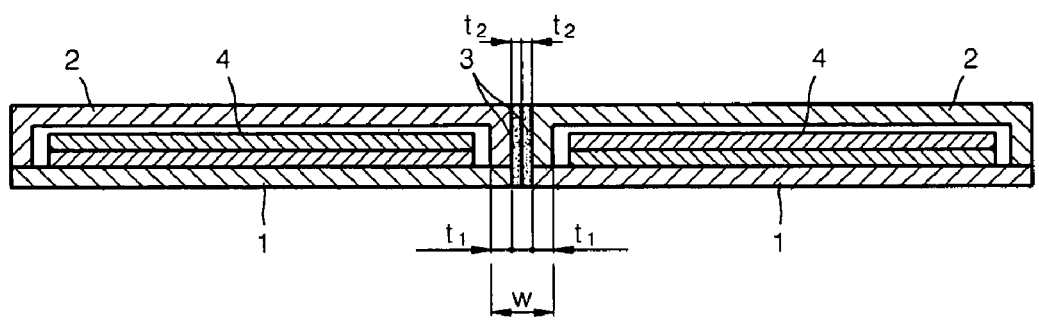
FIG. 1 is a cross-sectional view of a conventional multi-display panel.

The invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

FIGS. 2 to 5 are cross-sectional views illustrating procedures for manufacturing a multi-panel display device according to an exemplary embodiment of the invention. The multi-panel display device may be formed by connecting a plurality of panels, however, for the convenience of explanation, a sample case where only two panels are connected will be explained. FIGS. 2 to 5 also schematically illustrate two display elements 20 for forming an image.

Figure 2:
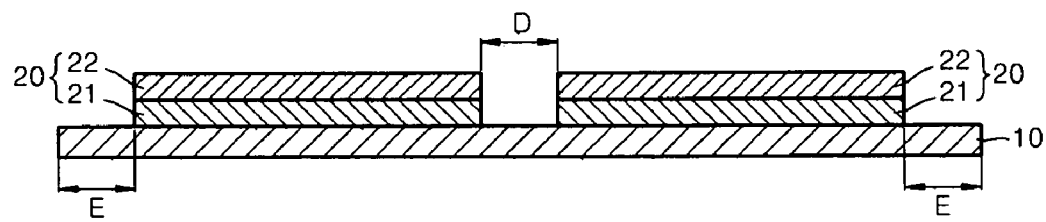
FIG. 2 to 5 are cross-sectional views illustrating procedures for manufacturing a multi-panel display device according to an exemplary embodiment of the invention.

First, as shown in FIG. 2, the display elements 20 are mounted on two portions of a substrate 10. For example, when an electro luminescent display ("ELD") is used as the display element 20, a thin film transistor ("TFT") circuit layer 21 and an organic light emission diode ("OLED") layer 22 are successively formed on the substrate 10 to make each of the display elements 20. Each of the display elements 20 forms a unit of the image display. Conventionally, a display element is formed in a separate process and then two display elements are combined. However, in the present invention, the display elements 20 are formed in one process and placed at a distance D therebetween for subsequent separation of the substrate 10.

Figure 3:
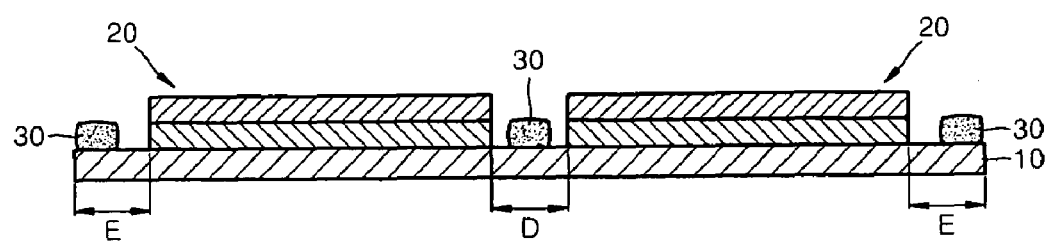
Figure 4:
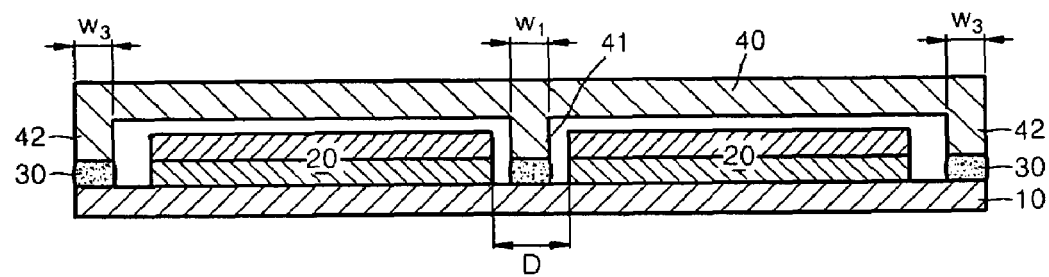

Referring to FIG. 3, after the display elements 20 have been mounted on the substrate 10, an adhesive 30 is applied in a space corresponding to the distance D and outer edges E of the substrate 10. Then, a glass cover 40 is fixed at the locations where the adhesive 30 was applied, as shown in FIG. 4. The display elements 20 and the substrate 10 are sealed by the cover glass 40 with a space between the substrate 10 and the glass cover 40. A width of W1 of a wall 41 of the glass cover 40 located in the space corresponding to the distance D may be less than about 1.0 mm. This construction is effective to minimize the display of a discontinued image in a connecting portion between the display elements 20. When the width of the connecting portion between the display elements 20 is less than about 1.5 mm, the visual discontinuation of the two image displays is reduced and appears to be a smooth transition therebetween. Therefore, when the width W1 of the wall 41 is less than about 1.0 mm, the display of the image is good in spite of the connecting portion between the display elements 20. Also, when the display elements 20 are separated and then attached to each other again, the display of image is good because the width W1 of the connecting portion is maintained to be less than about 1.5 mm.

Figure 5:
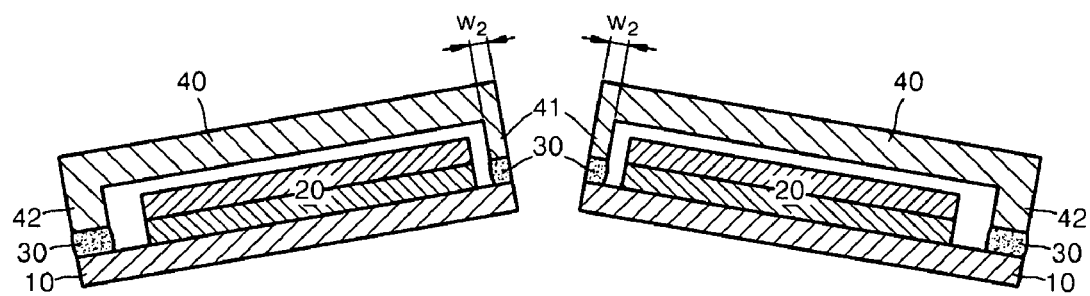

After the glass cover 40 is attached with the adhesive 30, two units of the image display are formed by cutting along a center of the wall 41, thereby bisecting the wall 41 as shown in FIG. 5. The cutting may be performed by mechanical cutting using a cutting tool or by optical cutting using a laser. Thus, the separated wall 41 becomes an edge of the unit image display panel and the width W2 of the edge is one half the width W1 of the wall 41 before cutting. Thus, when the width W1 is 1.0 mm before cutting, the width W2 is 0.5 mm after cutting, with work tolerance being ignored.

When a multi-panel display device is formed by connecting two units of the image display, two panels are connected with a connection portion which is constructed by attaching edges of the cut walls 41 of the panels each having a thickness W2. The connecting method may be a hinge connection method or an adhesive connection method. In either case, an image consisting of two images displayed on the two respective panels has a smooth connecting portion therebetween because the connection portion is very thin (e.g., width of connecting portion is two times W2 which is substantially the same as the width W1 previous to cutting the wall 41, which is substantially the same width as the outer edge 42).

In other words, the wall 41 formed after cutting the glass cover 40 plays a role of sealing the display element 20 along with the outer edge 42, and the width W1 of the wall 41 before being cut in half is nearly the same as the width W3 of the outer edge 42 of the glass cover 40. Therefore, the width W1 of the wall 41 of the cover glass 40 is appropriate to use with the adhesive 30 to cover the substrate 10 and the display elements 20 to minimize a visual defect on an image, thus allowing an image to be smoothly displayed on the multi-panel display Although in the present exemplary embodiment the display element 20 is an ELD, other display elements such as LCDs, FEDs, PDPs, etc., may be applied.

Figure 6:
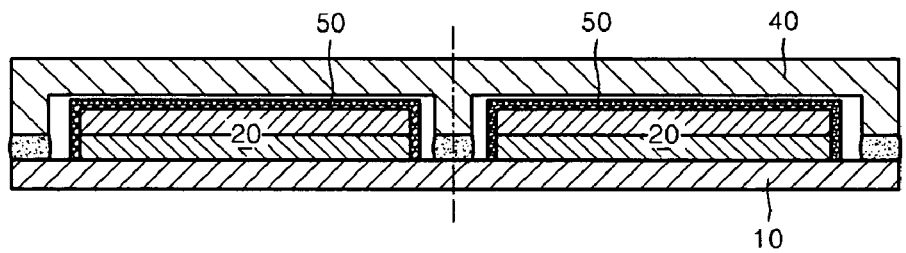
FIG. 6 is a cross-sectional view of a multi-panel display device according to another exemplary embodiment of the invention.

According to another exemplary embodiment of the present invention referring to FIG. 6, the display elements 20 mounted on the substrate 10 may be covered with a passivation layer 50. The passivation layer 50 may be formed of $Al_2O_3$, $SiO_2$, poly vinyl acetate (PVA), photo acryl (PA) or polyimide (PI), for example, to protect the display elements 20, before the cover glass 40 is mounted.

Since units of the image display are formed by cutting a plurality of display elements, the method of manufacturing the multi-display panel presented above, has the following advantages.

First, since the connecting portion of the joined panels is narrow and almost half of that of the connecting portions found in the conventional art, an image formed by two panels looks natural.

Second, the manufacturing process is simplified because the display elements for the units of the display image are formed in one process.

Third, since the multi-panel display device is constructed of display elements made in a single process, there is no characteristic difference between the units of the image display panels, and thus the quality of the image is uniformly maintained.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a multi-panel display device, the method comprising:
    mounting a plurality of display elements on a substrate;
    covering the substrate and the display elements with a glass cover having walls for partitioning each of the display elements;
    cutting the substrate and the glass cover along the walls and separating the display elements to respectively form image units; and
    connecting two image units together by attaching edges of the cut walls.

2. The method of claim 1, wherein the covering of the substrate and the display elements with the glass cover further comprises applying an adhesive on the substrate at locations corresponding to the walls of the cover glass, and adhering the glass cover to the substrate.

3. The method of claim 1, wherein a width of the wall of the cover glass before the cutting is less than about 1.0 mm and a width of the wall after cutting is less than about 0.5 mm.

4. The method of claim 1, further comprising covering each of the display elements with a passivation layer.

5. The method of claim 4, wherein the passivation layer is formed of one of $Al^2O^3$, $SiO^2$, poly vinyl acetate (PVA), photo acryl (PA) or polyimide (PI).

6. The method of claim 1, wherein the display element is one of an LCD, an FED, an OLED and a PDP.

7. The method of claim 1, wherein the cutting is one of mechanical cutting using a cutting tool and optical cutting using a laser.

8. The method of claim 1, wherein the connecting is one of a hinge connection method or an adhesive connection method.

* * * * *